United States Patent [19]

Geusic et al.

[11] 4,334,291

[45] Jun. 8, 1982

[54] ION-IMPLANTED MAGNETIC BUBBLE MEMORY WITH DOMAIN CONFINEMENT RAILS

[75] Inventors: Joseph E. Geusic; Dirk J. Muehlner, both of Berkeley Heights; Terence J. Nelson, New Providence, all of N.J.

[73] Assignee: Bell Telephone Laboratories, Incorporated, Murray Hill, N.J.

[21] Appl. No.: 184,115

[22] Filed: Sep. 4, 1980

[51] Int. Cl.³ .............................................. G11C 19/08
[52] U.S. Cl. ...................................... 365/36; 365/29; 365/15
[58] Field of Search ....................... 365/29, 35, 36, 39, 365/3, 1, 37, 44, 15

[56] References Cited

U.S. PATENT DOCUMENTS 4,001,796  1/1977  Voegeli ................................. 365/29
4,028,685  6/1977  Eggenberger et al. ............... 365/35

Primary Examiner—James W. Moffitt
Attorney, Agent, or Firm—Herbert M. Shapiro

[57] ABSTRACT

Operating margins for major-minor magnetic bubble memories are improved by use of protective rails between minor loops to prevent loss of information due to stripout. The rails, as are the propagation paths, are defined by unimplanted regions in an otherwise ion-implanted layer. In another embodiment, unimplanted rectangular islands are used rather than rails.

9 Claims, 5 Drawing Figures

ION-IMPLANTED MAGNETIC BUBBLE MEMORY WITH DOMAIN CONFINEMENT RAILS

FIELD OF THE INVENTION

This invention relates to magnetic bubble memories and more particularly to such memories in which bubbles move along paths defined by patterns of ion-implanted regions.

BACKGROUND OF THE INVENTION

Magnetic bubble memories are well known in the art. One mode of operating such memories is called a field-access mode as is also well known. A field access mode bubble memory is characterized by a magnetic field reorienting, typically rotating, in the plane of bubble movement. Bubbles, in response to the cyclical changes in the magnetic field, move along paths defined by magnetically soft elements such as Permalloy or by a repetitive pattern of ion-implanted regions.

Ion-implanted magnetic bubbles memories are disclosed in U.S. Pat. No. 3,792,452 of M. Dixon, R. A. Moline, J. C. North, L. W. Varnerin, Jr., and R. Wolfe, issued Feb. 12, 1974. Shown therein is a familiar magnetic bubble memory organization commonly referred to as major-minor organization. A bubble memory organized in such a manner is characterized by a plurality of closed loop paths termed "minor" loops and at least one "major" path or loop. A bubble generator and a detector are associated with the major path, and data, represented by a bubble pattern, are moved between ends of the minor loops and the major path typically at transfer ports.

Propagation patterns in ion-implanted bubble memories comprise a pattern of bulges and cusps formed typically by a series of unimplanted contiguous discs in an otherwise implanted region. Bubbles adhere to the boundary between implanted and unimplanted regions, and in response to the reorienting in-plane field, move from cusp to cusp along the path of propagation.

The major path can have any one of a variety of geometries. U.S. Pat. No. 4,238,836 of T. M. Burford, filed Mar. 7, 1979, shows a G-shaped path closed into a loop. The major loop is organized in such a manner that bubbles can be transferred out of one end of the minor loops and into the other end. U.S. Pat. No. 4,249,249 of P. I. Bonyhard and T. J. Nelson, filed Dec. 3, 1979, shows the major loop folded into a U-shaped configuration enclosing the minor loops between the legs of the U.

Whatever the configuration of the major loop, the minor loops generally comprise parallel closed paths formed by the above-mentioned contiguous discs. For transfer to occur, the ends of the minor loops must be in proximity to specific portions of the major path. To allow for maximum storage density, the period along the major loop is taken equal to the period within the minor loops and the separation distance between minor loops is typically one period. In other words, in a circuit with an $8\mu$ period, the distance between corresponding bulges in adjacent minor loops is $8\mu$.

It is desirable to produce bubble memories with as wide operating margins as possible. At least, theoretically, operating margins may extend from bubble "collapse" at high bias fields to bubble "stripout" at low bias fields where the bias field is the familiar field antiparallel to the magnetization of the bubble and operative to maintain the bubble at some nominal operating diameter. In ion-implanted bubble memories, a considerable portion of the low bias field margins above the normal stripout value is lost because of the tendency of the bubbles to stripout along charged walls that extend from one minor loop to an adjacent minor loop for certain directions of the in-plane field. Consequently, the theoretical margins have not been realized or even closely approximated in ion-implanted bubble memories. The problem thus, is to provide an ion-implanted magnetic bubble memory with an increased low bias margin range.

This problem is most acute in the region occupied by the minor loops because, as mentioned before for high storage density, the separation between adjacent loops is small. There, if charged wall enhanced stripout occurs, the end of the strip domain, not propagating along the minor loop to which the bubble belongs, is attracted to the implant boundary forming the propagation path of the next adjacent minor loop. Specifically, during portions of the propagation cycle when the drive field is oriented along one of three axes determined by the crystal symmetry, bubbles tend to "lash out" from bulges of a minor loop to cusps of an adjacent minor loop and vice versa. Once the two ends of an elongated bubble are "anchored" in two different minor loops, control is lost over which loop the bubble eventually will occupy. In this way, information is inadvertently lost or scrambled.

In the interest of higher storage capacity, one endeavors to create memories with increasingly smaller propagation periods and close spacing between loops. However, in ion-implanted memories, stripout between adjacent minor loops is a limitation on minor loop spacing.

BRIEF DESCRIPTION OF THE INVENTION

This invention is directed at an ion-implanted magnetic bubble memory which includes a protective rail between adjacent minor loops to prevent loss of information due to spontaneous transfer between the loops. The rail is disposed parallel to the minor loops on either side of it. Because the rail, like the propagation paths of an ion-implanted circuit, is defined by an unimplanted area in an otherwise implanted layer, it can be formed at the same time as are the propagation paths.

The rail is operative, not to prevent charge wall enhanced stripout, but to prevent an elongated bubble in a minor loop reaching a neighboring minor loop. When stripout occurs, the end of the elongated (strip) domain not attached to the minor loop may touch the implant boundary forming one side of the rail. Because the rail is smooth and featureless, the attraction felt for it by the bubble is less than that felt for the propagation path of the minor loop. Bubbles in minor loops are tightly coupled to pole patterns termed "charged walls" which, due to the threefold axes of symmetry of the host material, form on the periphery of the unimplanted contiguous discs of the minor loop. Motion of the charged walls, in response to the cyclically reorienting field, drives the bubbles along propagation paths. The strip domain finds no such strongly attractive charged walls associated with the rail. Therefore, when the strip domain contracts back to a bubble geometry, the bubble occupies its proper place in the minor loop and no data is lost.

In another embodiment, the rail is separated into rectangular unimplanted islands. Because such a chain of islands is not featureless as is the rail the improvement in the bias margin for minor loops separated by rectangular islands is not as large as for minor loops separated by rails. However, the multiple rectangle configuration is of interest because its effectiveness demonstrates that the rail need not be perfect, and that even if it is flawed, for example, discontinuous, it will produce an increase in the bias margins for ion-implanted circuits. The effectiveness of the multiple rectangles also shows that stripout only need be inhibited along certain directions or phases of the in-plane field while for other fields phases the bubble stays on the propagation path.

DETAILED DESCRIPTION

Figure 1:
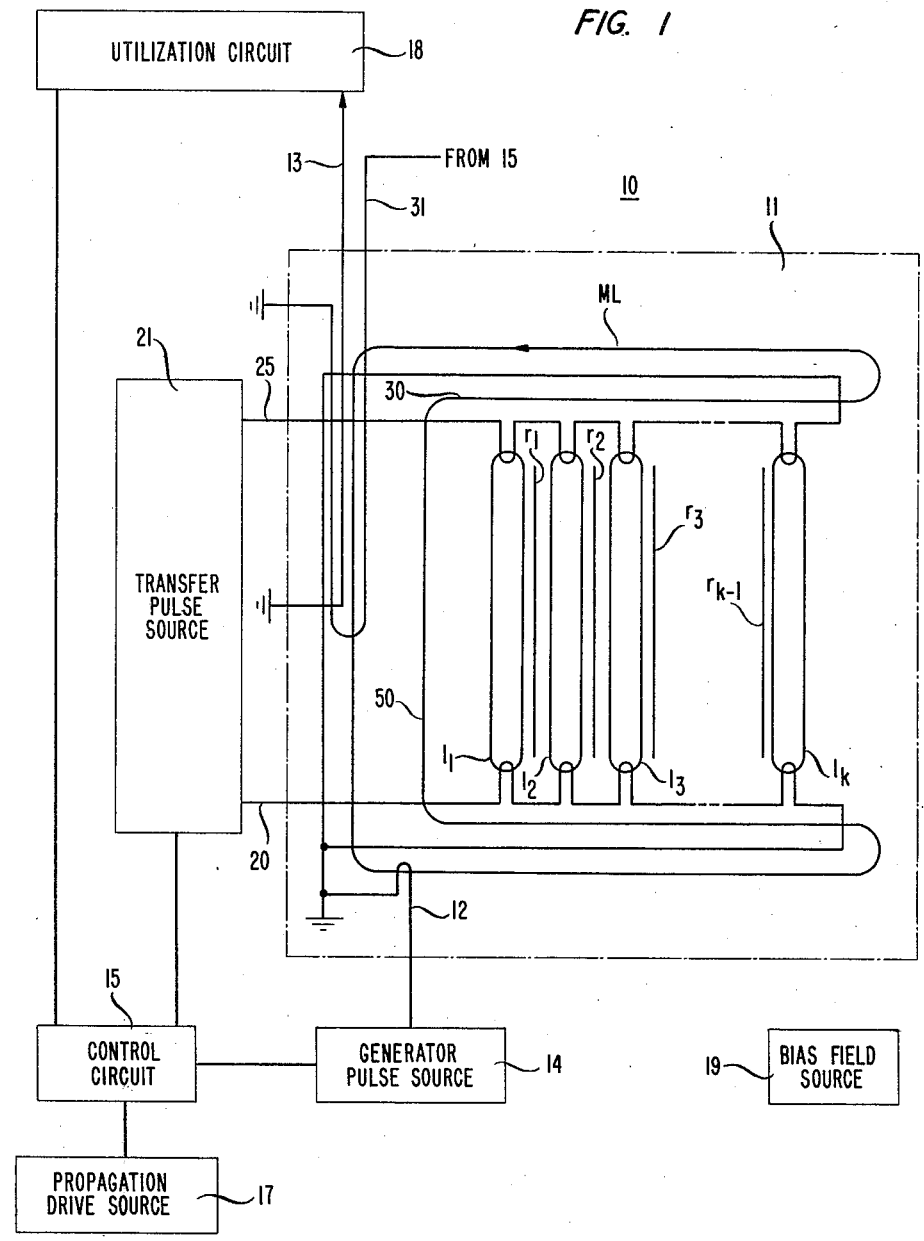
FIG. 1 is a schematic block diagram of a magnetic bubble memory having a major-minor organization.

FIG. 1 shows a magnetic bubble memory 10 including a host layer 11 of a material in which magnetic bubbles can be moved. Bubbles are moved in layer 11 in closed loops $l_1, l_2 \ldots$ and $l_k$ which are commonly referred to as minor loops, and in addition, in what may be thought of as a single loop ML commonly referred to as a major loop. In accordance with this invention, the minor loops are shown separated by protective rails $r_1$, $r_2 \ldots$ and $r_{k-1}$. In the illustrative embodiment, loop ML is folded into the U-shaped configuration mentioned hereinbefore enclosing the minor loops between the top and bottom legs.

Permanent storage of data is provided by the minor loops. The major loop, on the other hand, provides for access to the minor loops of substitute data from a bubble generator 12 and for read out of addressed data at a detector 13. In this connection, generator 12 comprises an electrical conductor connected between a generator pulse source 14 and ground operative under the control of control circuit 15 to provide a pulse selectively during each cycle of a propagation drive field. A suitable source for such a field is well known and is represented herein by block 17. Detector 13 similarly is shown connected between a utilization circuit 18 and ground and may include a magnetoresistance detector element. Bubbles are maintained at a normal diameter by a bias field supplied by source 19.

We will adopt the convention that data, generated at 12, move counterclockwise about loop ML to locations at the lower ends of minor loops $l_i$ in response to successive propagation cycles of the in-plane field. A transfer-in conductor 20 couples these ends of the minor loops with associated stages of the major loop for transferring new data into the minor loops at the proper time. Conductor 20, to this end, is connected between a transfer pulse source 21 and ground as shown.

A similar transfer operation, termed a transferout operation occurs at the top ends of the minor loops as viewed. The transfer-out operations is controlled by a pulse in conductor 25 which is similarly connected between pulse source 21 and ground. The control of the transfer function as well as the generator, propagation, and detector operation, is derived from a master clock in accordance with well understood principles. Such circuitry along with an address register is considered to be included within control circuit 15.

The general organization of the memory of FIG. 1 thus can be seen to involve the generation of a bubble pattern at 12 for later storage in the minor loops by the activation of transfer conductor 20 during a write operation. Also involved is the transfer-out of addressed data from the minor loops by the activation of transfer-out conductor 25. The data transferred out advances to detector 13 for applying signals representative of the transferred bubble pattern to utilization circuit 18. The data moves counterclockwise along loop ML until a later transfer-in operation moves the data back into vacancies at the bottom of the minor loops as viewed.

In this connection, it is helpful to recognize that bubbles usually move synchronously in all the loops of the memory. When a transfer-out operation occurs, vacancies are left in the addressed bit locations in the minor loops. Those vacancies move about the minor loops as the transferred data move to detector 13. The number of stages in the minor loops and the number in the major loop are chosen so that data transferred out or data generated at 12 arrive at the lower end of the minor loops synchronously with those vacancies.

The operation of the transfer gates and of the U-shaped major loop is described more fully in the above-mentioned application of Bonyhard and Nelson. Transfer-out involves a double transfer. In response to transfer pulses on conductor 25, a pattern of bubbles moves first into auxiliary path 30 and thereafter into loop ML during a single transfer cycle. In response to subsequent cycles of the in-plane field, the pattern moves counterclockwise in major loop ML to the area of the detector coupled by conductor 13.

The implanted areas of the detector region are of a geometry and orientation to elongate a bubble as it propagates. As the bubble propagates, control circuit 15 pulses conductor 31 to stretch the bubble for activating a magnetoresistance element formed (by Permalloy) as part of detector 13.

The flow of data represented by a bubble pattern from an address in memory (in the minor loops) selected by the transfer operation and detected by utilization circuit 18 via the magnetoresistance element, moves along loop ML after detection. Meanwhile, vacancies left in minor loops, due to the transfer, move counterclockwise synchronously. The data move in loop ML to the transfer-in region as do the originating vacancies in the minor loops. In response to a pulse on conductor 20, bubbles are transferred from loop ML to the vacancies in the minor loops.

Figure 4:
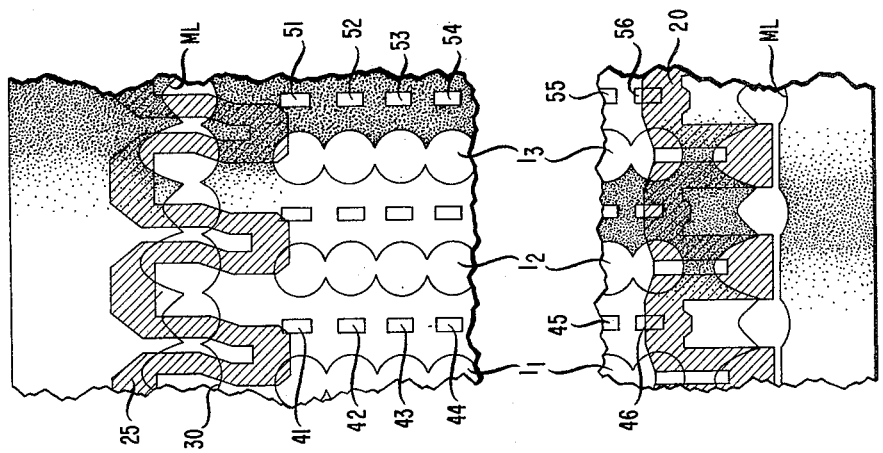
FIGS. 3 and 4 are enlarged top views of portions of a memory of the type shown in FIG. 1 illustrating different embodiments of this invention.
Figure 3:
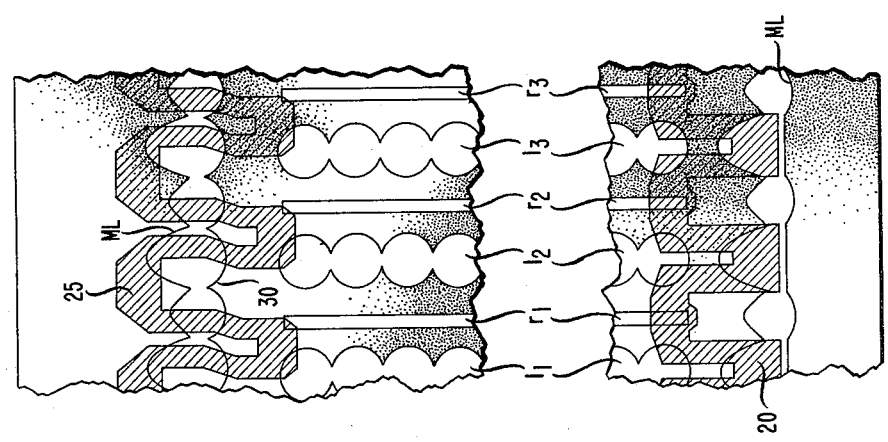
Figure 2:
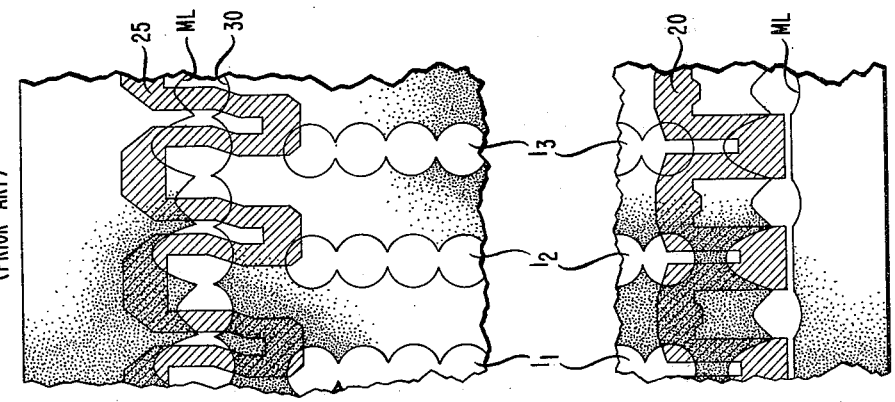
FIG. 2 is an enlarged top view of a portion of a prior art memory of the type shown in FIG. 1.

We will now direct out attention to the region occupied by the minor loops. FIGS. 2, 3, and 4 show minor loops $l_1$, $l_2$, and $l_3$ (greatly shortened for simplicity), major loop ML, and transfer conductors 20 and 25. FIG. 2 shows the prior art configuration. Bubbles propagate counterclockwise around the minor loops. In response to pulses on conductor 25, bubbles are transferred first to auxiliary path 30 and then to loop ML. Conductor 20, at the bottom end of the minor loops is operative to transfer bubbles from loop ML to the minor loops.

As explained hereinbefore, at low bias fields, bubbles have a tendency to "stripout" between minor loops. This stripout occurs when the in-plane drive field is oriented along one of three directions in layer 11 determined by the crystal symmetry of the layer. Because of the geometry of the minor loops, and the formation of charged walls, stripout generally occurs from a bulge in one minor loop to a cusp in an adjacent loop. Because stripout occurs only at certain phases of the drive field, one observes bubbles "lashing out" from the minor loop into the implanted region between minor loops. If a bubble elongates sufficiently to make contact with a propagation path of an adjacent minor loop, it is possible that information could be lost. As mentioned above, such transfer occurs typically from a bulge to a cusp. The attraction felt for the original minor loop is not any greater than that felt for a neighboring loop, so control is lost over which loop the bubble will eventually occupy.

FIG. 3 shows the major-minor configuration of FIG. 2, with the addition of rails formed by unimplanted regions in the otherwise ion-implanted area between minor loops. Rail $r_1$ separates minor loops $l_1$ and $l_2$ and rail $r_2$ separates loops $l_2$ and $l_3$. These rails serve as a wall between the loops to prevent loss of information due to stripout as described in connection with FIG. 1. The rails as seen in FIG. 3 are thin strips between minor loops and have lengths approximately equal to that of a minor loop. In the presence of the rails, stripout can occur without loss of information, because the elongated bubble is prevented from making contact with the minor loop on the other side of the rail. Rather, when stripout occurs, the elongated bubble makes contact with the rail, but finds no strongly attractive position. The attraction felt by the bubble for the charged walls which form around the contiguous discs of the minor loops and serve to drive the bubbles along the bulges and cusps which form the propagation path of the minor loops is greater than that felt for the smooth featureless rail. Therefore, when the elongated strip domain reduces back to a bubble geometry, it contracts back to the position from whence it came.

FIG. 4 shows the same major-minor configuration, with minor loops separated by multiple rectangular unimplanted islands (41–46 and 51–56) rather than by a rail. The rectangular islands serve the same purpose as the rail, and, in fact, can be thought of as a discontinuous rail. Placement of the rectangular islands is based on the observation that stripout generally occurs from a cusp of one minor loop to a bulge of an adjacent one and vice versa. The islands are shown placed between bulges in a manner to intercept such stripout.

Figure 5:
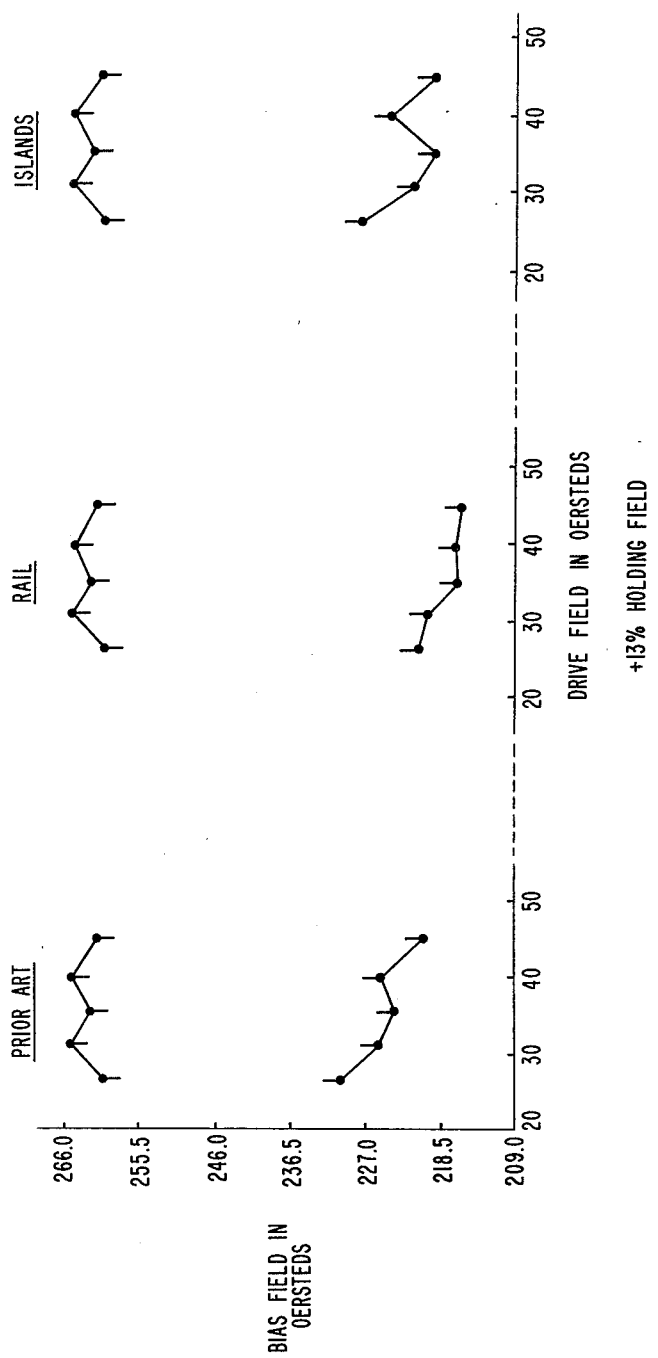
FIG. 5 is a graph of operating margins for minor loops having the configurations shown in FIGS. 2, 3, and 4.

The graph of FIG. 5 shows bias margins for the configurations of FIGS. 2, 3 and 4 at various drive fields. As is to be expected, the high limits of the bias field are not changed. The lowest tolerable bias fields, on the other hand, are different in each case. The prior art configuration has the smallest margin; the widest margin is for minor loops separated by rails. Use of rectangular islands also gives improvement in bias margins and is of interest not only in itself, but also because it shows that a rail that is not quite perfect and featureless is also operative to improve bias margins.

Rails or rectangular islands can be formed at the same time that the propagation path is formed, by a uniform implantation of $80/Ne^+/1E14$ ($Ne^+$ ions at 80KeV; followed by a selective implantation of $1 \times 10^{14}/cm^2$ dose)$+270/Ne^+/2E14+130/H^+_2/2E16/cm^2$. The memories have been tested in $8\mu$ period circuits at a 50 kHz rotating field frequency with the results shown in FIG. 5.

We claim:

1. A magnetic bubble memory comprising a layer of material in which magnetic bubbles can be moved, a pattern of unimplanted regions in an otherwise ion-implanted area in said layer defining at least first and second propagation paths thereabout along which bubbles can be moved in response to a field reorienting cyclically in the plane of said layer, said memory being characterized by means comprising a protective rail between said propagation paths for preventing loss of information due to stripout therebetween.

2. A magnetic bubble memory in accordance with claim 1 wherein said memory comprises a plurality of minor loops and at least one major path loop organized in a major-minor configuration, said memory including a protective rail between each pair of adjacent loops.

3. A magnetic bubble memory in accordance with claim 2 wherein said protective rail is parallel to said minor loops.

4. A magnetic bubble memory in accordance with claim 3 wherein said minor loops comprise unimplanted contiguous discs.

5. A magnetic bubble memory comprising a layer of material in which magnetic bubbles can be moved, a pattern of unimplanted regions in an otherwise ion-implanted area in said layer defining paths thereabout along which bubbles can be moved in response to a field reorienting cyclically in the plane of said layer, and means for preventing loss of information due to stripout between adjacent paths, said means comprising a plurality of unimplanted islands in the otherwise implanted region between propagation paths.

6. A magnetic bubble memory in accordance with claim 5 wherein said unimplanted islands are rectangular in shape.

7. A magnetic bubble memory in accordance with claim 6 wherein said paths are adapted to circulate bubbles thereabout in a plurality of minor loops and at least one major loop.

8. A magnetic bubble memory in accordance with claim 7 wherein said minor loops are parallel to each other, said unimplanted rectangular islands being situated between said minor loops.

9. A magnetic bubble memory in accordance with claim 8 wherein said minor loops comprise unimplanted contiguous discs forming a propagation path of alternating bulges and cusps, said unimplanted rectangular islands being centered on the axis connecting corresponding bulges in adjacent minor loops.

* * * * *